United States Patent
Zhu et al.

(10) Patent No.: US 7,528,451 B2
(45) Date of Patent: May 5, 2009

(54) CMOS GATE CONDUCTOR HAVING CROSS-DIFFUSION BARRIER

(75) Inventors: Huilong Zhu, Poughkeepsie, NY (US); Thomas W. Dyer, Pleasant Valley, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 11/692,402

(22) Filed: Mar. 28, 2007

(65) Prior Publication Data

US 2008/0237749 A1 Oct. 2, 2008

(51) Int. Cl.
*H01L 29/76* (2006.01)
(52) U.S. Cl. .................. 257/385; 257/392; 257/412
(58) Field of Classification Search ................. 257/385, 257/392, 412; 438/218
See application file for complete search history.

(56) References Cited

U.S. PATENT DOCUMENTS 5,550,079 A * 8/1996 Lin ............................ 438/587
2008/0157215 A1* 7/2008 Miyashita ................... 257/374

* cited by examiner

*Primary Examiner*—Trung Dang
(74) *Attorney, Agent, or Firm*—Daryl Neff; H. Daniel Schnurmann

(57) ABSTRACT

A gate conductor is provided for a transistor pair including an n-type field effect transistor ("NFET") having an NFET active semiconductor region and a p-type field effect transistor ("PFET") having a PFET active semiconductor region, where the NFET and PFET active semiconductor regions are separated by an isolation region. An NFET gate extends in a first direction over the NFET active semiconductor region. A PFET gate extends in the first direction over the PFET active semiconductor region. A diffusion barrier is sandwiched between the NFET gate and the PFET gate. A continuous layer extends continuously in the first direction over the NFET gate and the PFET gate. The continuous layer contacts top surfaces of the NFET gate and the PFET gate and the continuous layer includes at least one of a semiconductor, a metal or a conductive compound including a metal.

20 Claims, 9 Drawing Sheets

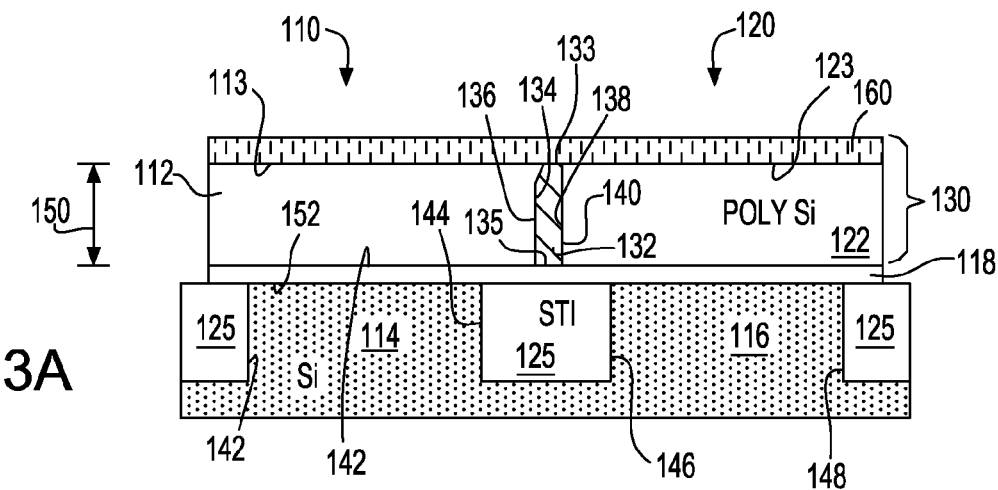
FIG. 3A
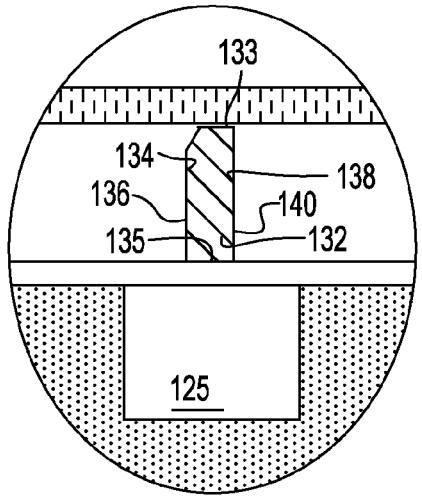
FIG. 3B
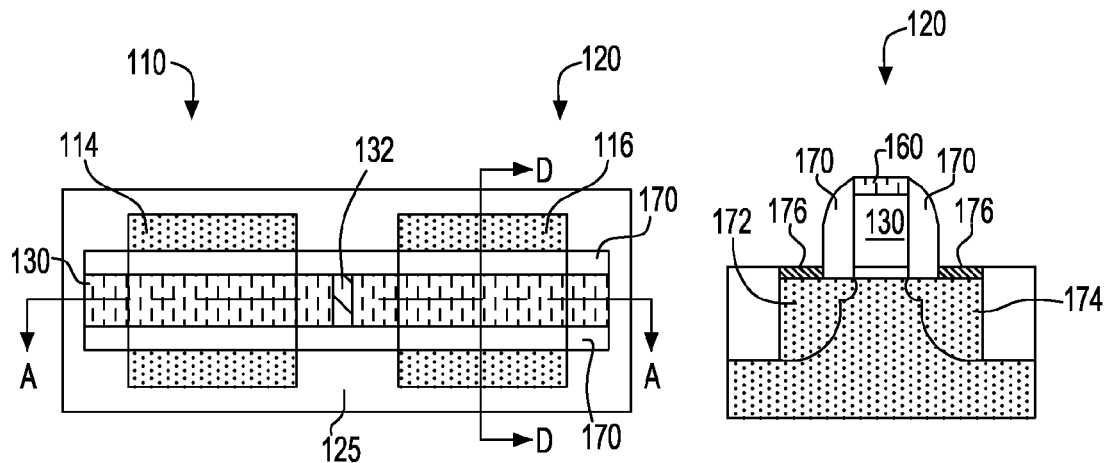
FIG. 3C
FIG. 3D

US 7,528,451 B2

CMOS GATE CONDUCTOR HAVING CROSS-DIFFUSION BARRIER

BACKGROUND OF THE INVENTION

The present invention relates to semiconductor devices and their fabrication. More particularly, the present invention relates to a method of forming a gate conductor structure having a cross-diffusion barrier for inhibiting diffusion of a dopant between adjacent devices.

FIGS. 1 and 2 illustrate a complementary metal oxide semiconductor ("CMOS") transistor pair in accordance with the prior art. The CMOS transistor pair includes an n-type conduction channel field effect transistor ("NFET") 10 and a p-type conduction channel field effect transistor ("PFET") 20. A polyconductor 30, consisting essentially of a polycrystalline semiconductor such as polysilicon, includes a gate 32 of the NFET, a gate 34 of the PFET and a conductor extending over a trench isolation region 25 between the NFET and the PFET. Ideally, the gate 32 of the NFET would have an n+ dopant concentration throughout and no part of the gate 32 would have a p+ dopant concentration. Ideally, the gate 34 of the PFET would have a p+ dopant concentration throughout, and no part of the gate 34 would have an n+ dopant concentration.

However, during fabrication of the CMOS transistor pair, the diffusion of dopants in the directions indicated by the arrows 38 can cause portions of the gates 32, 34 to have both n+ and p+ dopant concentrations. A portion 40 of the polyconductor overlapping the gates 32, 34 has both n+ and p+ dopant concentrations.

SUMMARY OF THE INVENTION

In accordance with an embodiment of the invention, a gate conductor is provided for a transistor pair including an n-type field effect transistor ("NFET") having an NFET active semiconductor region and a p-type field effect transistor ("PFET") having a PFET active semiconductor region, where the NFET and PFET active semiconductor regions are separated by an isolation region. An NFET gate extends in a first direction over the NFET active semiconductor region. Desirably, a PFET gate extends in the first direction over the PFET active semiconductor region and a diffusion barrier is sandwiched between the NFET gate and the PFET gate. Desirably, a continuous layer, including at least one of a semiconductor, a metal or a conductive compound including a metal, extends continuously in the first direction over the NFET gate and the PFET gate. Desirably, the continuous layer contacts top surfaces of the NFET gate and the PFET gate.

BRIEF DESCRIPTION OF THE DRAWINGS

FIG. 3A is a sectional view of a gate conductor structure in accordance with an embodiment of the invention, the section taken through line A-A of FIG. 3C.

FIG. 3B is a magnified partial sectional view of the gate conductor structure illustrated in FIG. 3A.

FIG. 3C is a corresponding plan view of the gate conductor structure illustrated in FIG. 3A.

FIG. 3D is a corresponding sectional view through line D-D of the gate conductor structure illustrated in FIG. 3C.

DETAILED DESCRIPTION

Figure 1:
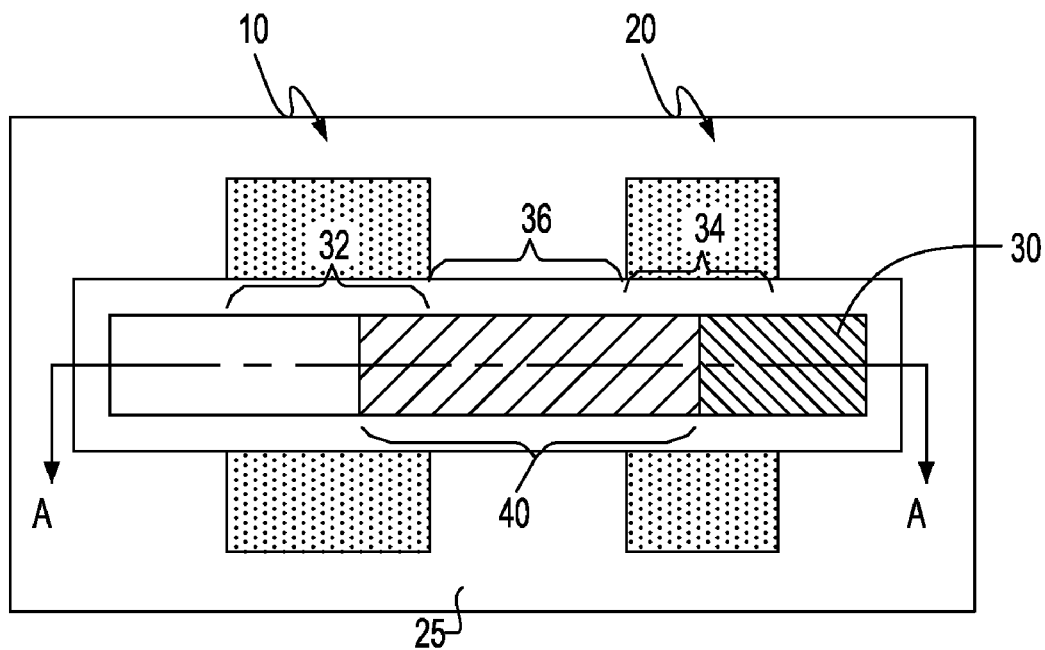
FIG. 1 is a plan view of a gate conductor structure for a complementary NFET and PFET transistor pair in accordance with the prior art.
Figure 2:
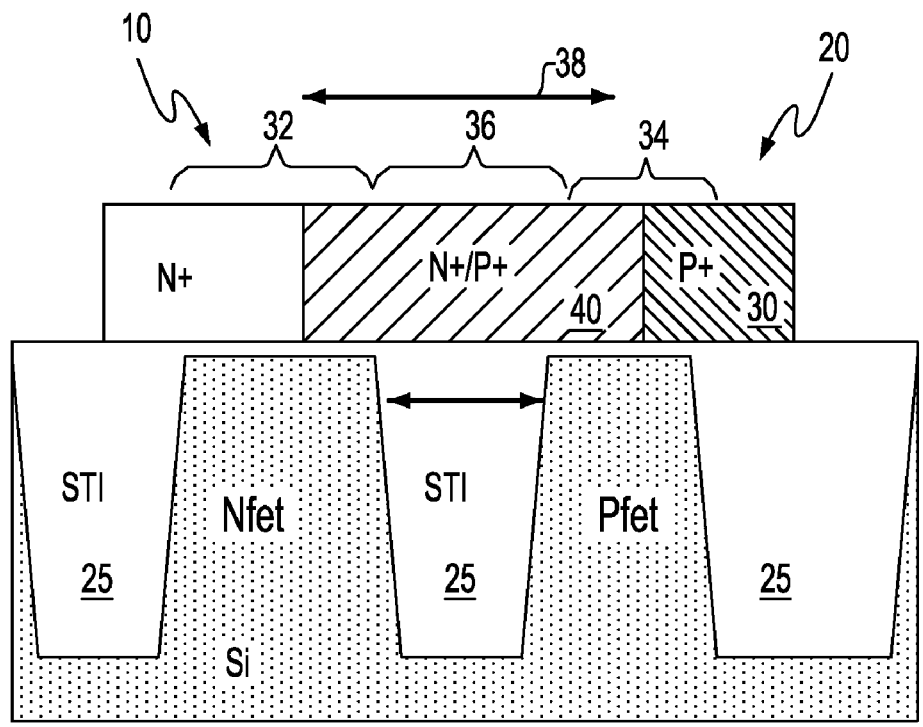
FIG. 2 is a corresponding sectional view of the complementary NFET and PFET transistor pair in accordance with the prior art.

As transistor dimensions continue to be scaled from one technology generation to the next, the size of gate conductors and other transistor elements shrinks. Certain effects of in the fabrication process can become magnified as a result. Dopants diffuse from one portion of a semiconductor region to another at a rate dependent upon temperature and time, regardless of the size of the semiconductor region. When a polyconductor which serves as an NFET gate and a PFET gate is scaled to smaller dimensions to meet demands of a later technology generation, the effect of dopant diffusion becomes magnified. An n-type dopant diffuses in a direction from the NFET gate towards the PFET gate and a p-type dopant diffuses in a direction from the PFET gate towards the NFET gate. If the distance separating the NFET and the PFET is small, a portion of the NFET gate can become p+ doped and a portion of the PFET gate can become n+ doped.

It can be demonstrated that the presence of a p+ dopant concentration in even a portion of an n+ doped gate of an NFET can cause the threshold voltage of the NFET to shift upward, such that the NFET requires a higher positive gate voltage to turn on. Similarly, the presence of a p+ dopant concentration in a portion of an n+ doped gate of an NFET can cause the threshold voltage of the PFET to shift downward, such that the PFET requires a lower negative gate voltage to turn on.

Accordingly, as illustrated in FIG. 3A, an NFET 110 has a gate 112 extending over a first active semiconductor region 114 of a semiconductor substrate. A PFET 120 has a gate 122 extending over a second active semiconductor region 116 of the semiconductor substrate. When the NFET is turned on, the first active semiconductor region conducts the current of the NFET and, therefore, can be referred to as an NFET active semiconductor region. Similarly, when the PFET is turned on, the second active semiconductor region conducts the current of the PFET and can be referred to as a PFET active semiconductor region.

The first and second active semiconductor regions are separated by a trench isolation region 125, e.g., a shallow trench isolation region ("STI"). The trench isolation region 125 desirably is disposed adjacent to peripheral edges 142, 144 of the first active semiconductor region 114, and adjacent to peripheral edges 146 and 148 of the second active semiconductor region 116.

The semiconductor substrate can consist essentially of a Group IV element, e.g., silicon, germanium, or an alloy of silicon with one or more Group IV elements, e.g., germanium, carbon, etc. or an alloy of germanium with one or more Group IV elements. Alternatively, the semiconductor substrate can include one or more III-V compounds (e.g., one or more compounds each of which includes a Group III element with a Group V element) or one or more II-VI compounds (compounds including a Group II element with a Group VI element).

The gate 112 of the NFET 110 and the gate 122 of the PFET are portions of a gate conductor 130 which is separated from the first and second active semiconductor regions 114, 116 by a gate dielectric layer 118. The gate dielectric layer 118 typically consists essentially of one or more of silicon dioxide, silicon nitride or a combination thereof such as silicon oxynitride or an oxide-nitride-oxide ("O—N—O") dielectric. Alternatively, the gate dielectric layer 118 can include a high dielectric constant ("high-K") material such as a ferroelectric dielectric, perovskite, zeolite, or any other suitable dielectric material having a dielectric constant greater than 4.0. The gate conductor typically includes a polycrystalline semiconductor material in contact with the gate dielectric layer. However, the gate conductor can include a metal, e.g., titanium, tungsten, among others or a conductive compound of a metal in contact with the gate dielectric layer, especially when the gate dielectric layer 118 includes a high-K dielectric material.

The gate conductor 130 includes a diffusion barrier 132 sandwiched between the NFET gate 112 and the PFET gate 122. Stated another way, the diffusion barrier 132 has a first wall 134 adjacent to an edge 136 of the NFET gate 112. The diffusion barrier 132 inhibits diffusion of dopants between the NFET gate 112 and the PFET gate 122. Desirably, the diffusion barrier blocks or substantially blocks diffusion of dopants between the NFET gate and the PFET gate during the process of fabricating the NFET and the PFET and afterwards, such as during post-production testing and during the use lifetime of the devices. The diffusion barrier 132 also has a second wall 138 adjacent to an edge 140 of the PFET gate 122. Desirably, the first and second walls 134, 138 are oriented in a vertical direction, i.e., a normal direction or a generally normal direction with respect to a major surface 152 of the active semiconductor regions and desirably, the first and second walls define the vertical height 150 of the diffusion barrier 132. Desirably, the first wall 134 of the diffusion barrier is wholly contacted by the edge 136 of the NFET gate 112 and the second wall 138 of the diffusion barrier is wholly contacted by the edge 140 of the PFET gate 122. As further shown in FIGS. 3A-3B, a bottom surface 135 of the diffusion barrier 132 contacts the gate dielectric layer 118. Specifically, the bottom surface 135 of the diffusion barrier contacts a top surface 142 of the gate dielectric layer 118.

The gate conductor 130 also includes a continuous layer 160 which contacts top surfaces 113, 123 of the NFET gate and the PFET gate, respectively and overlies a top surface 133 of the diffusion barrier 132. The continuous layer includes at least one of a semiconductor, a metal or a conductive compound of a metal. Desirably, the continuous layer includes at least a metal or a conductive compound of a metal. In one example, the continuous layer includes a silicide. The continuous layer may include a metal which can be reacted with silicon to form a silicide, or may include both a silicide and such silicide-forming metal. The continuous layer 160 provides electrical continuity between the NFET gate and the PFET gate.

FIG. 3C is a corresponding plan view of the gate conductor 130, as shown extending over the first and second active semiconductor regions 114, 116. As best seen in FIG. 3D, a source region 172 and a drain region 174 of the PFET are provided in the second active semiconductor region. While not shown, the source and drain regions of the NFET appear similar to the ones of the PFET shown in FIG. 3D. Desirably, a low-resistance layer 176 including a silicide overlies the source and drain regions of each of the PFET and NFET. Such layer 176 may have a composition similar or identical to the composition of the continuous layer 160 which overlies the polycrystalline semiconductor layer of the gate conductor 130 and may be formed simultaneously therewith by application of the same processing steps.

Figure 4A:
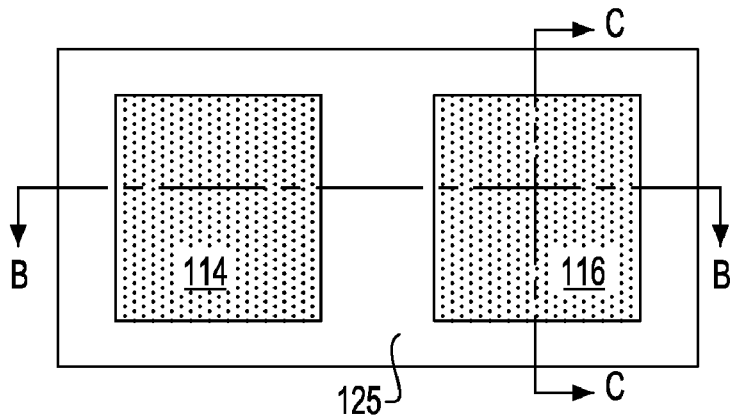
FIG. 4A is a plan view illustrating a stage in fabrication of the gate conductor structure (FIGS. 3A-D).
Figure 4B:
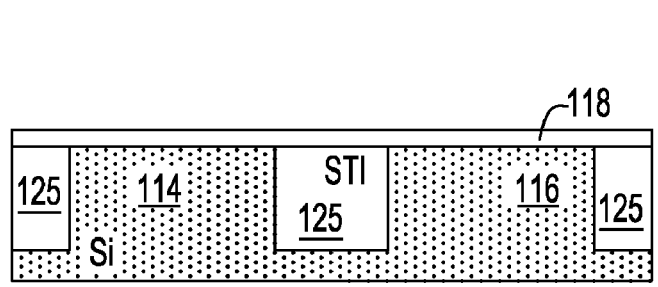
FIG. 4B is a corresponding sectional view through line B-B of FIG. 4A.
Figure 4C:
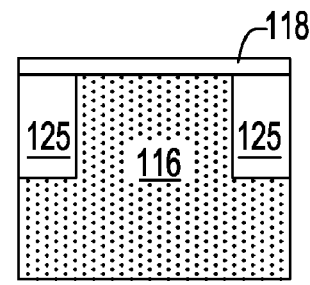
FIG. 4C is a corresponding sectional view through line C-C of FIG. 4A.

FIGS. 4A-C illustrate an initial stage of fabrication in which a shallow trench isolation ("STI") region 125 is formed. The STI region 125 has openings which define a first active semiconductor region 114 and a second active semiconductor region 116. After forming the STI region, a gate dielectric layer 118 is formed which overlies the first and second active semiconductor regions 114, 116. The gate dielectric layer 118 can be formed, for example, by deposition of an oxide, a nitride, an oxynitride, or a combination of two or more such materials. For example, the dielectric layer 118 can include silicon oxide, silicon nitride, silicon oxynitride, or a layered combination of such materials as an oxide-nitride-oxide ("O—N—O") dielectric, among others. Alternatively, the gate dielectric layer can include one or more high-K dielectric materials, among which include, but are not limited to: perovskite materials, ferroelectric dielectrics, zeolites, lead zirconium titanate, etc., among others.

Figure 5:
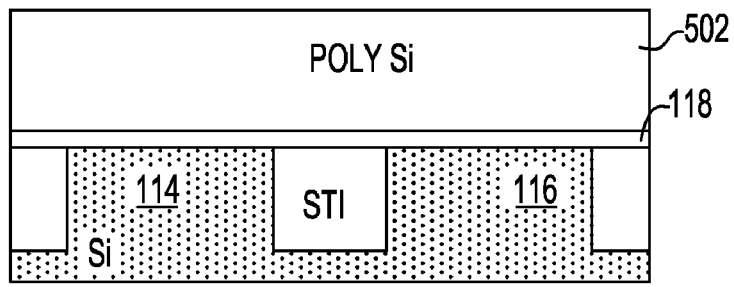
FIG. 5 is a sectional view illustrating a stage of fabrication subsequent to that shown in FIGS. 4A-C.

Subsequently, as illustrated in FIG. 5, a polycrystalline semiconductor material 502 such as polysilicon is deposited to overlie the gate dielectric layer 118 over both the first and second active semiconductor regions 114, 116. Typically, this step is performed by blanket deposition of polysilicon over at least areas of the wafer in which NFETs and PFETs are to be formed. Thereafter, a patterning process removes the polycrystalline semiconductor layer overlying the first active semiconductor region 114, while the polycrystalline semiconductor layer 604 overlying the second active semiconductor region 116 is allowed to remain in place.

Figure 7A:
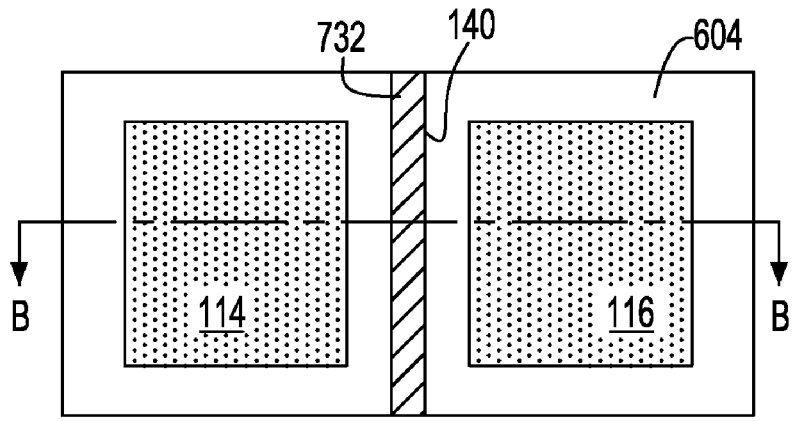
FIG. 7A is a plan view illustrating a stage of fabrication subsequent to that shown in FIG. 6.
Figure 7B:
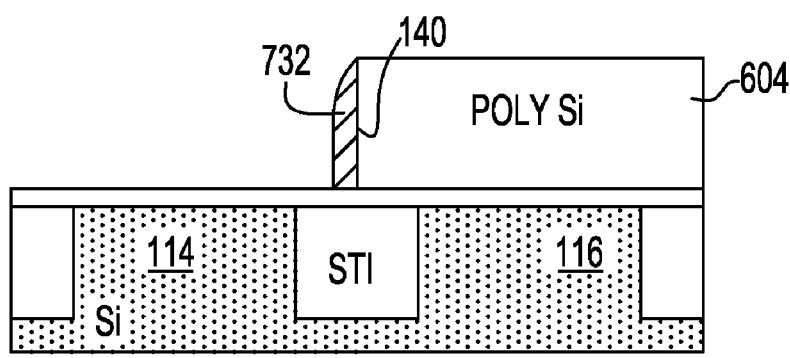
FIG. 7B is a corresponding sectional view through line B-B of FIG. 7A.

Thereafter, as illustrated in FIGS. 7A-B, a diffusion barrier layer 732 is formed which extends in a vertical direction along and adjacent to an edge 140 of the polycrystalline semiconductor layer 604 overlying the second active semiconductor region 116. In one example, the diffusion barrier includes a dielectric material such as silicon nitride, silicon oxide or both. Alternatively, or in addition thereto, the diffusion barrier can include a high-K dielectric material. In another example, the diffusion barrier can include a semiconductive or conductive diffusion barrier. Conductive diffusion barrier materials include nitrides of titanium, tungsten, tantalum, among others. In one example, a diffusion barrier can be formed by depositing a layer of silicon nitride conformally over the exposed surfaces of the polycrystalline semiconductor layer and the gate dielectric layer and then etching the silicon nitride layer by an anisotropic etch process in the vertical direction, such as by a reactive ion etch ("RIE") process. The anisotropic etch process removes the silicon nitride layer in locations other than where it extends in the vertical direction along the edge 140 of the semiconductor layer 604.

Figure 8:
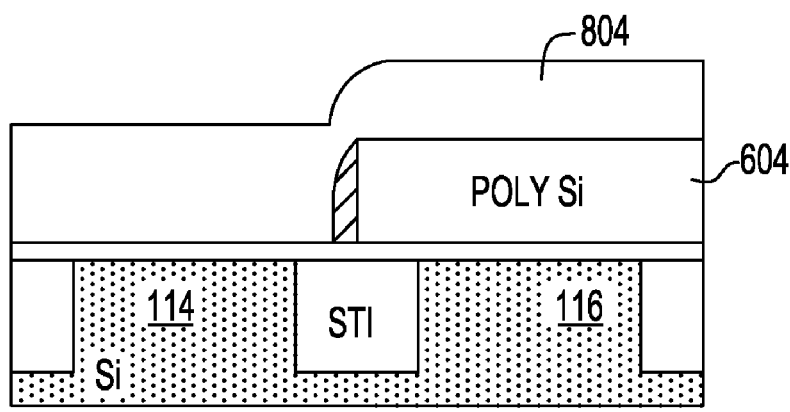
FIG. 8 is a sectional view illustrating a stage of fabrication subsequent to that shown in FIGS. 7A-B.

Thereafter, as illustrated in FIG. 8, a further polycrystalline semiconductor layer 804 is deposited to overlie the first active semiconductor region 114 and the second active semiconductor region 116 such that layer 804 overlies the polycrystalline semiconductor layer. Typically, this step is performed by blanket depositing a polycrystalline semiconductor, e.g., polysilicon.

Figure 9A:
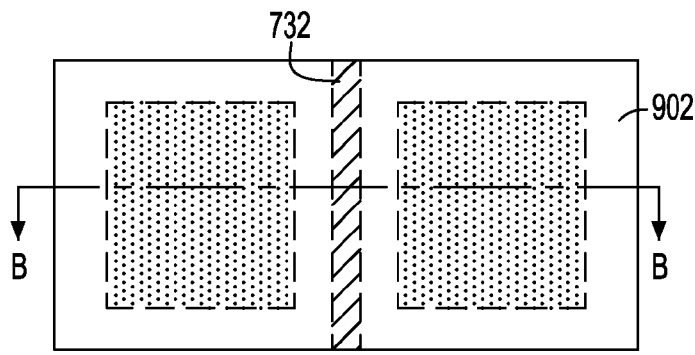
FIG. 9A is a plan view illustrating a stage of fabrication subsequent to that shown in FIG. 8.
Figure 9B:
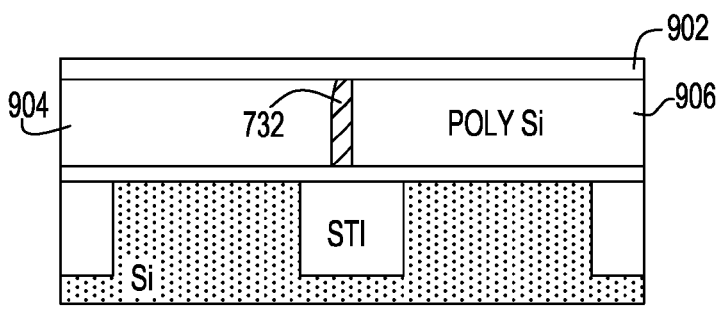
FIG. 9B is a corresponding sectional view through line B-B of FIG. 9A.

Thereafter, after further processing, a layer 902 of polycrystalline semiconductor material, e.g., polysilicon, remains as a continuous layer overlying a first polycrystalline portion 904, a second polycrystalline portion 906 and the diffusion barrier 732 between the two portions. The structure shown in FIGS. 9A-B can be formed by applying one or more planarization techniques, e.g., an etch process, deposition process, chemical mechanical polishing ("CMP") or a combination of such processes, to the structure shown in FIG. 8 to reduce the height of polycrystalline layer 804 in relation to layer 604. Alternatively, the polycrystalline layer 804 can be planarized, e.g., by CMP, to the top of the diffusion barrier 732, after which another polycrystalline layer is deposited, and optionally planarized such as by using CMP, to form the layer 902.

Thereafter, referring to FIGS. 3A-3D again, the first and second polycrystalline layers and the diffusion barrier are patterned by photolithography to the dimensions of the final gate conductor 130. The dielectric spacers 170 (FIGS. 3C-D) are formed adjacent to edges of the gate conductor 130. Portions of the gate dielectric layer 118 which overlie the first and second active semiconductor regions beyond edges of the dielectric spacers 170 are removed.

Implants are performed into exposed portions of the first and second active semiconductor regions 114, 116 to form the source region and drain region 172 and 174 for each of the NFET and PFET devices. The implants also impart an appropriate dopant at this time to the gates 112, 122 of each transistor. For example, the first active semiconductor region 114 and the NFET gate 112 is implanted with an n-type dopant while a masking layer, e.g., a patterned photoresist overlies the second active semiconductor region 116 and the PFET gate 122. The second active semiconductor region 116 and the PFET gate 122 is implanted with a p-type dopant while a masking layer, e.g., a patterned photoresist overlies the first active semiconductor region 114 and the NFET gate 112.

A silicide-forming metal, e.g., tungsten, nickel, cobalt, among others, can then be deposited onto exposed surfaces of the polycrystalline semiconductor material of the gate conductor and the source and drain regions. The substrate then is heated to cause the metal to react with the semiconductor material with which it is in contact, after which unreacted metal overlying the dielectric spacers 170, trench isolation region 125, etc., is selectively removed in relation to the silicide. In such way, the low-resistance continuous layer 160 and silicide layer 176 can be formed.

Figure 6:
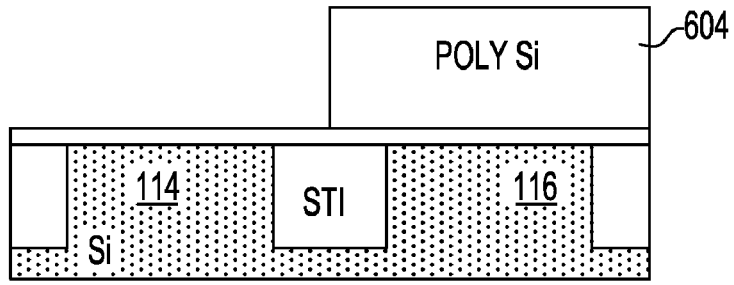
FIG. 6 is a sectional view illustrating a stage of fabrication subsequent to that shown in FIG. 5.

In one variation of the above-described embodiment, during the process shown in FIG. 6, instead of removing the portion of the polycrystalline semiconductor layer 502 (FIG. 5) overlying the NFET active semiconductor region, the portion of layer 502 overlying the PFET active semiconductor region is removed. Then the remaining portion overlies the NFET active semiconductor region. The diffusion barrier 732 (FIGS. 7A-B) then is formed along a wall of that remaining portion and the further polycrystalline semiconductor layer 804 is deposited in contact with a portion of the gate dielectric layer overlying the PFET active semiconductor region.

Figure 10A:
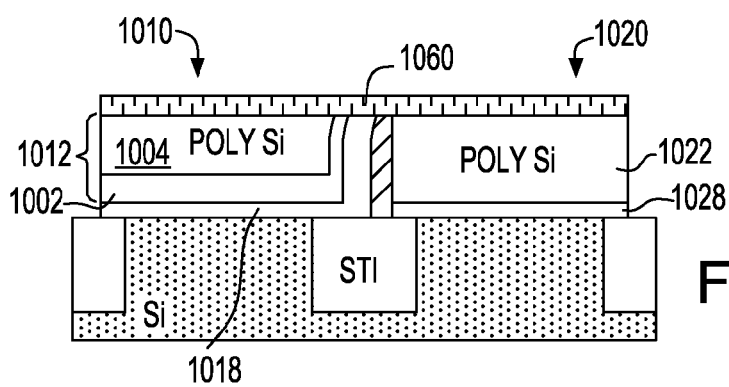
FIG. 10A is a sectional view through line A-A of FIG. 10C illustrating a gate conductor structure according to a variation of the embodiment illustrated in FIGS. 3A-3D.
Figure 10C:
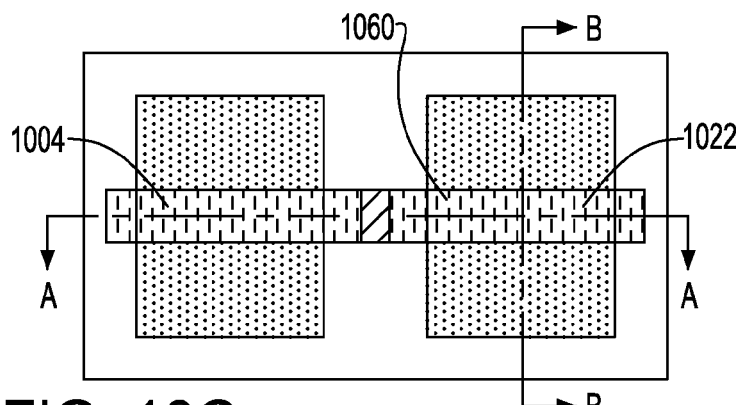
FIG. 10B is a corresponding sectional view through line B-B of FIG. 10C.
Figure 10B:
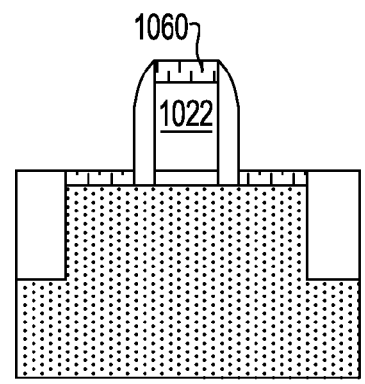

Referring to FIGS. 10A-C, another variation of the above-described embodiment will now be described. In this embodiment, one of the transistors, e.g., an NFET 1010, includes a high-K gate dielectric layer 1018 and a metal gate layer 1002 in contact with the high-K gate dielectric. A polycrystalline semiconductor layer 1004, e.g., a polysilicon layer, overlies the metal gate layer 1002. The metal gate layer 1002, polysilicon layer and a low-resistance continuous layer 1060 operate together as a gate of the NFET. In the case of the other transistor, e.g., a PFET 1020, the gate of the PFET includes the low-resistance continuous layer, a polysilicon layer 1022 and a gate dielectric layer 1028 which can include, for example, one or more of silicon dioxide and silicon nitride.

Figure 11A:
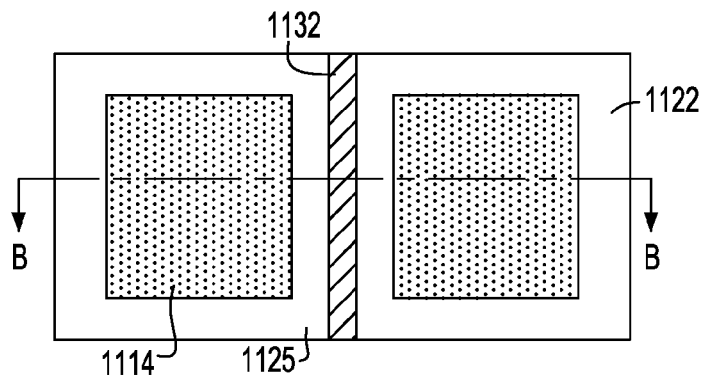
FIG. 11A is a plan view illustrating a stage in fabrication of the gate conductor structure illustrated in FIGS. 10A-C.
Figure 11B:
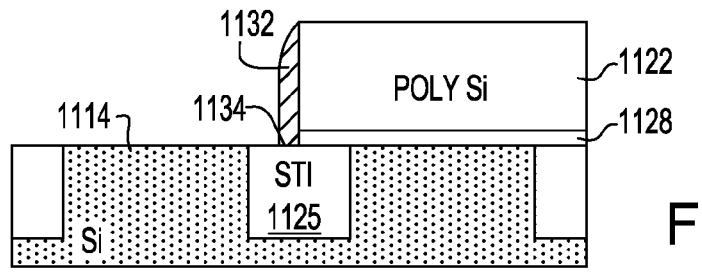
FIG. 11B is a corresponding sectional view through line B-B of the gate conductor structure illustrated in FIG. 11A.
Figure 12A:
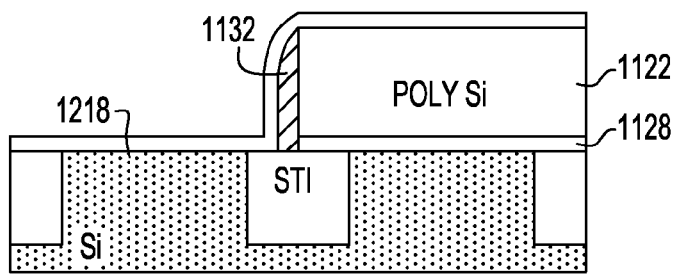
FIG. 12A is a sectional view through line A-A of FIG. 12C illustrating a stage in fabrication of the gate conductor structure illustrated in FIGS. 10A-C subsequent to that shown in FIGS. 11A-B
Figure 12C:
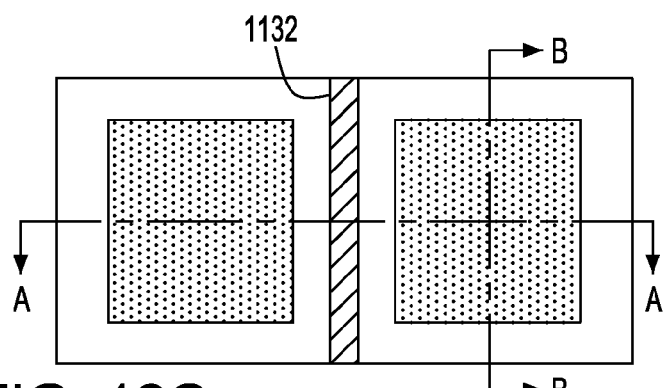
FIG. 12C is a plan view corresponding to the sectional views illustrated in FIGS. 12A and 12B.
Figure 12B:
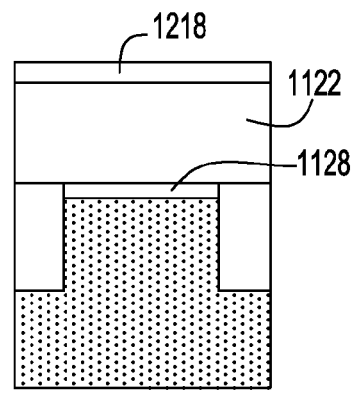
FIG. 12B is a corresponding sectional view through line B-B of FIG. 12C.

To fabricate the structure shown in FIGS. 10A-C, a polysilicon layer 1122, overlying a layer 1128 of the gate dielectric material is deposited and patterned with the gate dielectric layer to expose the first active semiconductor region 1114 (FIGS. 11A-B). The diffusion barrier 1132 then is formed along an edge of the polysilicon layer 1122. In such case, a bottom surface 1134 of the diffusion barrier contacts the trench isolation region 1125. Alternatively, the diffusion barrier can be formed such that it overlies the gate dielectric layer 1128. For example, the polysilicon layer can be selectively removed to leave the gate dielectric layer in place, after which a diffusion barrier layer material is deposited, and then the gate dielectric layer be removed during when that layer is patterned to form the diffusion barrier 1132, or afterwards. Next, as illustrated in FIGS. 12A-12C, a layer including the high-K dielectric material 1218 is deposited to overlie the first active semiconductor region 1114, the diffusion barrier 1132 and the polysilicon layer 1122.

Figure 13A:
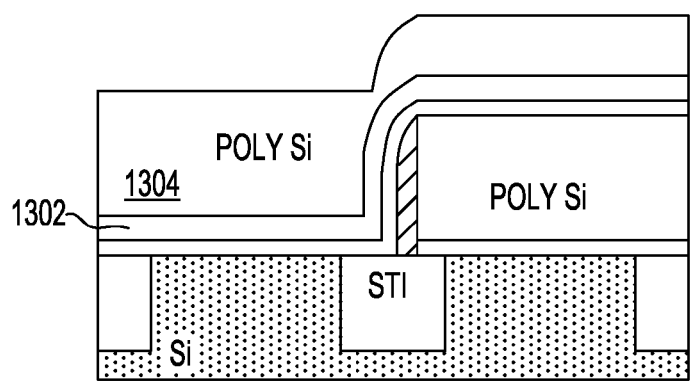
FIG. 13A is a sectional view corresponding to a section through line A-A of FIG. 12C illustrating a stage of fabrication subsequent to that shown in FIGS. 12A-C.
Figure 13B:
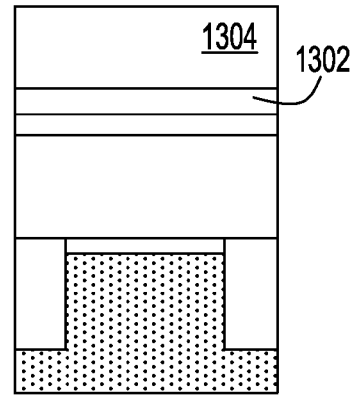
FIG. 13B is a corresponding sectional view taken through line B-B (FIG. 12C) illustrating the stage of fabrication shown in FIG. 13A.
Figure 14:
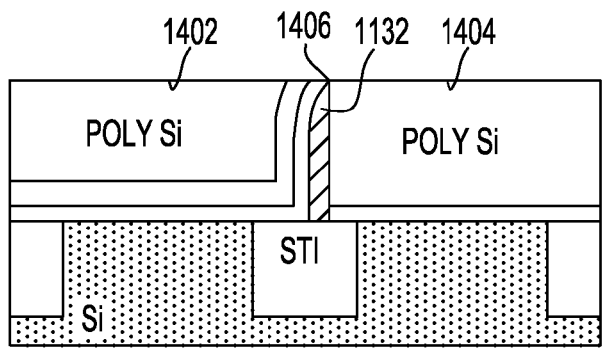
FIG. 14 is a sectional view corresponding to a section through line A-A of FIG. 12C illustrating a stage of fabrication subsequent to that shown in FIGS. 13A-B.
Figure 15:
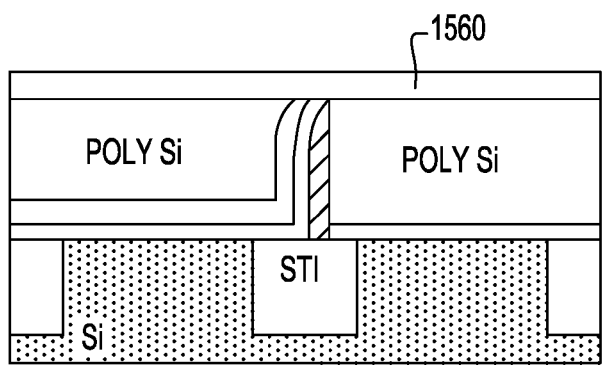
FIG. 15 is a sectional view corresponding to a section through line A-A of FIG. 12C illustrating a stage of fabrication subsequent to that shown in FIG. 14.

Thereafter, as further illustrated in FIGS. 13A-B, a metal gate layer 1302 and then a second polysilicon layer are deposited in succession over the structure. After planarization (FIG. 14), top surfaces 1402, 1404 of the deposited layers are about even with a top surface 1406 of the diffusion barrier 1132. FIG. 15 illustrates the structure after formation of a continuous polycrystalline semiconductor layer, e.g., polysilicon layer 1560. After further processing as described above with respect to FIGS. 3A-3D, the structure shown in FIG. 15 is patterned to form the gates 1012, 1022 (FIGS. 10A-C) having a continuous layer 1060, the continuous layer which desirably includes a low-resistance material such as a silicide, metal, metal compound or combination thereof.

In a variation of the above embodiment (FIGS. 10A-15), the PFET includes the high-K gate dielectric layer and the metal gate layer and the NFET includes the polysilicon layer and non-high-K gate dielectric layer. In such embodiment, the structure of the PFET and its fabrication are similar to that described above for the NFET (FIGS. 10A-C) except that a p-type dopant must be present in the PFET gate and the source and drain regions of the PFET. The structure of the NFET and its fabrication are similar to that described above for the PFET (FIGS. 10A-C) except that an n-type dopant must be present in the NFET gate and the source and drain regions of the NFET.

Figure 16:
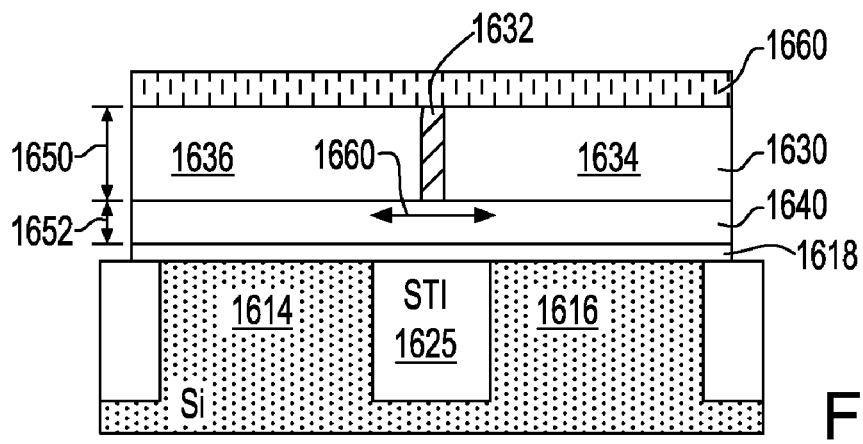
FIG. 16 is a sectional view corresponding to a section through line A-A of FIG. 3C illustrating a gate conductor structure in accordance with a variation of the embodiment illustrated in FIGS. 3A-D.

FIG. 16 illustrates a variation of the above-described embodiment (FIGS. 3A-D) in which the gate conductor includes a first polycrystalline semiconductor layer 1640 adjacent to the gate dielectric layer 1618, as well as a second polycrystalline semiconductor layer 1630 overlying the first polycrystalline layer 1640. The first polycrystalline semiconductor layer 1640 extends continuously over the first and second active semiconductor regions 1614, 1616 and the trench isolation region 1625 between them. The second polycrystalline semiconductor layer 1630 is divided into separate parts 1634, 1636 by the diffusion barrier 1632 which is sandwiched between the parts 1634 and 1636. Desirably, the diffusion barrier extends the height 1650 of the second polycrystalline layer 1630. The diffusion barrier inhibits dopants from crossing the diffusion barrier 1632 between one part 1634 of the gate conductor and the other part 1636, or from crossing the diffusion barrier from such part 1636 to part 1634. Similar to the above-described embodiment (FIGS. 3A-3D), the diffusion barrier 1632 has a first wall adjacent to an edge of the first part 1634. The diffusion barrier 1632 also has a second wall adjacent to an edge of the second part 1636.

Since the first polycrystalline semiconductor layer is continuous, some dopant diffusion may occur in the first polycrystalline semiconductor layer in the directions indicated by arrow 1660. However, a desirable result can still be achieved despite some diffusion within layer 1640. The thickness 1650 of the second polycrystalline layer is as great or greater than the thickness 1652 of the first layer 1640. Therefore, when the diffusion barrier succeeds in stopping dopant diffusion between parts 1634 and 1636, much of the ill effects of dopant diffusion are avoided.

Figure 17:
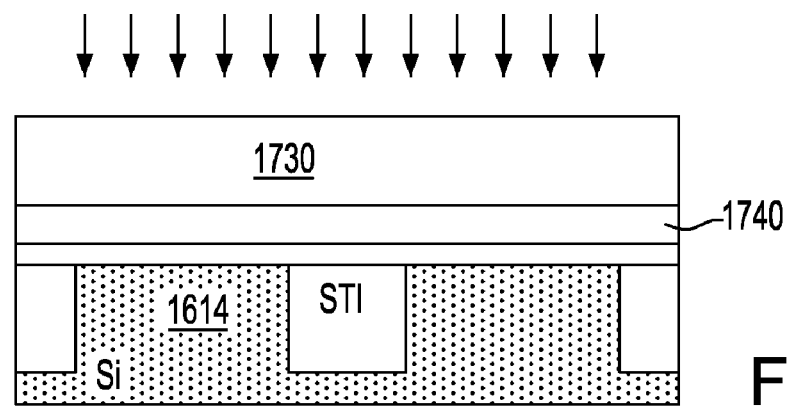
FIG. 17 is a sectional view corresponding to a section through line A-A of FIG. 3C illustrating a stage of fabrication subsequent to that shown in FIG. 16.

Referring to FIG. 17, in an exemplary method of fabricating the gate conductor structure, a first polycrystalline layer 1740 consisting essentially of polysilicon is deposited, after which a layer 1730 of polycrystalline silicon germanium is deposited thereon. An implant process is then conducted to implant an n+ dopant concentration in a portion of the layers 1730, 1740 overlying the substrate including in the first active semiconductor region 1614.

Figure 18:
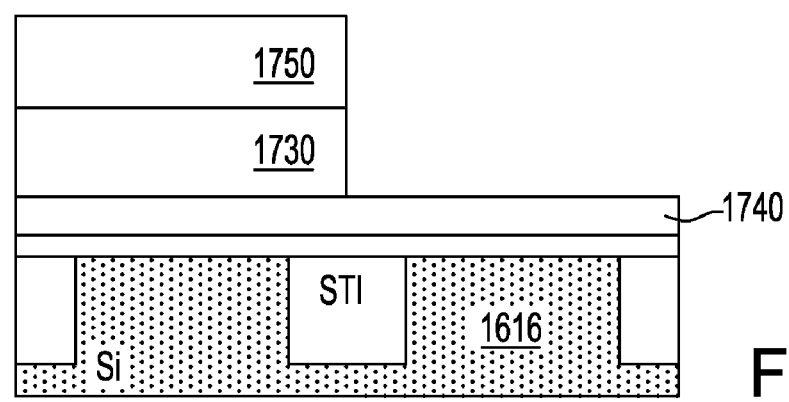
FIG. 18 is a sectional view corresponding to a section through line A-A of FIG. 3C illustrating a stage of fabrication subsequent to that shown in FIG. 17.

Then, as illustrated in FIG. 18, a portion of the polycrystalline silicon germanium layer 1730 which directly overlies the second active semiconductor region 1616 is removed. A layer of silicon nitride 1750 can be deposited and patterned. Thereafter, the exposed portion is removed by an etch process in a selective manner to the underlying polysilicon layer 1740.

Figure 19:
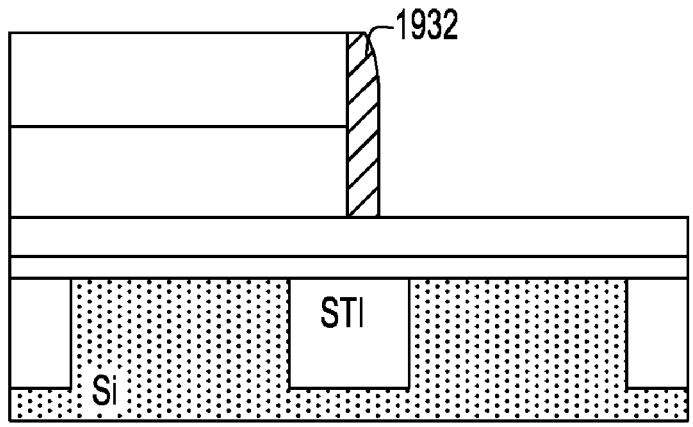
FIG. 19 is a sectional view corresponding to a section through line A-A of FIG. 3C illustrating a stage of fabrication subsequent to that shown in FIG. 18.
Figure 20:
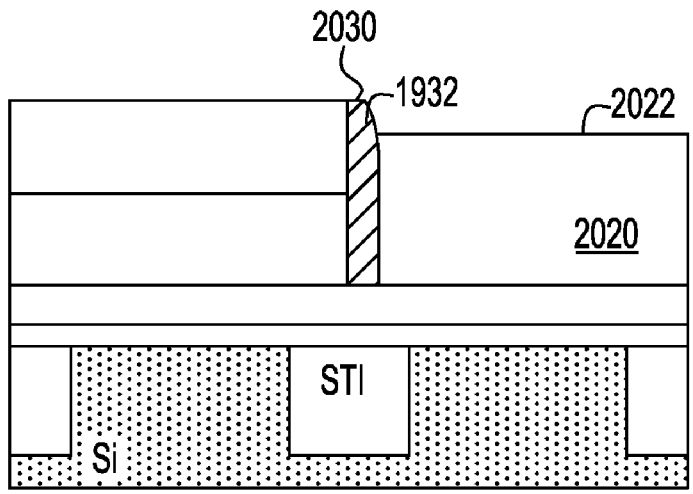
FIG. 20 is a sectional view corresponding to a section through line A-A of FIG. 3C illustrating a stage of fabrication subsequent to that shown in FIG. 19.

Subsequently, the diffusion barrier 1932 is formed adjacent to an exposed wall of the remaining polycrystalline silicon germanium layer (FIG. 19), and a second polycrystalline silicon germanium layer 2020 then is deposited and etched back or otherwise planarized such that a top surface 2022 of the layer 2020 is about even with the top surface 2030 of the diffusion barrier 1932 (FIG. 20). FIG. 16 shows the gate conductor structure after patterning and formation of a low-resistance continuous layer 1660.

In a variation of the above embodiment (FIGS. 16-20), during the process shown in FIG. 17, a p-type dopant implant is performed. Then, instead of removing the portion of semiconductor layer 1730 overlying the PFET active semiconductor region as shown in FIG. 18, the portion of that layer 1730 overlying the NFET active semiconductor region is removed instead. The diffusion barrier 1932 (FIG. 19) then is formed along a wall of that remaining portion and the further polycrystalline semiconductor layer 2020 is deposited in contact with a portion of the gate dielectric layer overlying the NFET active semiconductor region.

Figure 21:
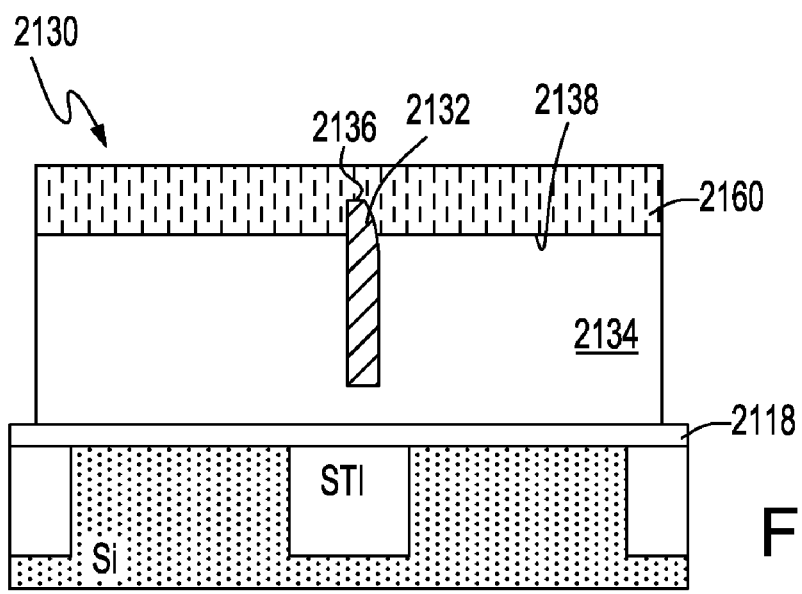
FIG. 21 is a sectional view corresponding to a section through line A-A of FIG. 3C illustrating a gate conductor structure in accordance with a variation of the embodiment illustrated in FIG. 16.

FIG. 21 illustrates a gate conductor structure 2130 in accordance with a variation of the embodiment shown in FIG. 16. As shown in FIG. 21, the gate conductor includes a layer 2134 consisting essentially of the same semiconductor material filling the volume between the gate dielectric layer 2118 and the continuous layer 2160. Desirably, the semiconductor layer 2134 consists essentially of polysilicon.

The gate conductor 2130 can be fabricated by processing similar to that described with reference to FIGS. 17-21 above, except that a single layer of polysilicon is deposited in place of the two layers 1730, 1740 shown in FIG. 17. Also, a portion of such polysilicon layer is removed by means of a timed etch rather than one which selectively removes polycrystalline silicon germanium (FIG. 18). After forming the diffusion barrier 2132 (FIG. 21), another layer of polysilicon is deposited to form the polysilicon layer 2134. Processing as described above continues in order to perform implants, form the continuous layer 2160 and define the dimensions of the gate. In the completed gate conductor 2130, the polysilicon layer 2134 may have a top surface 2138 about even with a top surface 2136 of the diffusion barrier.

While the invention has been described in accordance with certain preferred embodiments thereof, many modifications and enhancements can be made thereto without departing from the true scope and spirit of the invention, which is limited only by the claims appended below.

What is claimed is:

1. A gate conductor for a transistor pair including an n-type field effect transistor ("NFET") having an NFET active semiconductor region and a p-type field effect transistor ("PFET") having a PFET active semiconductor region, the NFET and PFET active semiconductor regions being separated by an isolation region, the gate conductor comprising:

an NFET gate extending in a first direction over the NFET active semiconductor region;

a PFET gate extending in the first direction over the PFET active semiconductor region;

a diffusion barrier sandwiched between the NFET gate and the PFET gate; and a continuous layer extending continuously in the first direction over the NFET gate and the PFET gate, the continuous layer contacting top surfaces of the NFET gate and the PFET gate, the continuous layer including at least one of a semiconductor, a metal or a conductive compound including a metal.

2. A gate conductor as claimed in claim 1, wherein the diffusion barrier has a first wall contacting an edge of the NFET gate and a second wall contacting an edge of the PFET gate, the diffusion barrier separating the NFET gate from the PFET gate.

3. A gate conductor as claimed in claim 2, wherein each of the PFET and the NFET includes a gate dielectric layer, the gate dielectric layer overlying the NFET active semiconductor region, the PFET active semiconductor region and the isolation region, wherein the diffusion barrier has a bottom surface contacting the gate dielectric layer.

4. A gate conductor as claimed in claim 3, wherein the diffusion barrier has a bottom surface contacting the isolation region.

5. A gate conductor as claimed in claim 1, wherein the NFET includes a first gate dielectric layer contacting the NFET active semiconductor region, the PFET includes a second gate dielectric layer contacting the PFET active semiconductor region, wherein a high-K gate dielectric layer selected from the first and second gate dielectric layers includes a gate dielectric material having a dielectric constant greater than 4.0 and the one of the NFET gate and the PFET gate contacting the high-K gate dielectric includes a metal contacting the high-K gate dielectric layer.

6. A gate conductor as claimed in claim 1, wherein the diffusion barrier has a bottom surface contacting the isolation region.

7. A gate conductor for a transistor pair including an n-type field effect transistor ("NFET") having an NFET active semiconductor region and a p-type field effect transistor ("PFET") having a PFET active semiconductor region, the NFET active semiconductor region and the PFET active semiconductor region being separated by an isolation region, the gate conductor comprising:

a continuous semiconductor layer extending continuously in the first direction over the NFET active semiconductor region, the PFET active semiconductor region and the isolation region;

a second semiconductor layer contacting a top surface of the continuous semiconductor layer and extending in the first direction over the NFET active semiconductor region, the PFET active semiconductor region and the isolation region, the second semiconductor layer being divided into an NFET part overlying the NFET active semiconductor region and a PFET part overlying the PFET active semiconductor region; and a diffusion barrier sandwiched between the NFET part and the PFET part.

8. A gate conductor as claimed in claim 7, wherein the diffusion barrier has a first wall contacting an edge of the NFET part and a second wall contacting an edge of the PFET part, the diffusion barrier separating the NFET part from the PFET part.

9. A gate conductor as claimed in claim 7, wherein each of the continuous semiconductor layer and the second semiconductor layer consists essentially of polysilicon.

10. A gate conductor as claimed in claim 7, wherein the continuous semiconductor layer consists essentially of polysilicon and the second semiconductor layer consists essentially of polycrystalline silicon germanium.

11. A method of fabricating a gate conductor for a transistor pair including an n-type field effect transistor ("NFET") having a first active semiconductor region and a p-type field effect transistor ("PFET") having a second active semiconductor region, the first and second active semiconductor regions separated by an isolation region, the gate conductor including an NFET gate extending over the first active semiconductor region, a PFET gate extending over the second active semiconductor region, the method comprising:

forming a gate dielectric layer and a first semiconductor layer separated from the first and second active semiconductor regions by the gate dielectric layer;

patterning the first semiconductor layer to remove at least a portion of the first semiconductor layer where the first semiconductor layer overlies one of the first and second active semiconductor regions, leaving a remaining portion of the first semiconductor layer overlying another one of the first and second active semiconductor regions;

forming a diffusion barrier overlying an edge of the remaining portion of the first semiconductor layer;

forming a second semiconductor layer overlying at least the one of the first and second active semiconductor regions, the second semiconductor layer having an edge overlying the diffusion barrier, such that the diffusion barrier separates at least a portion of the second semiconductor layer from the first semiconductor layer; and patterning and implanting the first and second semiconductor layers to form the NFET gate and the PFET gate separated from the NFET gate by the diffusion barrier.

12. A method as claimed in claim 11, wherein the diffusion barrier is formed to a have a first maximum height above the isolation region and the step of forming the second semiconductor layer includes depositing the second semiconductor layer to a second maximum height, the second maximum height being greater than the first maximum height.

13. A method as claimed in claim 11, wherein the diffusion barrier is formed to have a bottom surface contacting a top surface of the isolation region.

14. A method as claimed in claim 11, wherein the diffusion barrier is formed to have a bottom surface contacting the first semiconductor layer.

15. A method as claimed in claim 11, further comprising forming the NFET to include a first gate dielectric layer contacting the first active semiconductor region, forming the PFET to include a second gate dielectric layer contacting the second active semiconductor region, wherein a high-K gate dielectric layer selected from the first and second gate dielectric layers includes a gate dielectric material having a dielectric constant greater than 4.0 and the one of the first and second gate conductors contacting the high-K gate dielectric includes a metal contacting the high-K gate dielectric layer.

16. A method as claimed in claim 11, wherein each of the first and second semiconductor layers consists essentially of polysilicon.

17. A method as claimed in claim 11, wherein the first semiconductor layer consists essentially of polysilicon and the second semiconductor layer consists essentially of polycrystalline silicon germanium.

18. A method as claimed in claim 11, further comprising forming a continuous layer contacting top surfaces of the first and semiconductor layers, the continuous layer extending continuously over the first and second active semiconductor regions and the isolation region.

19. A method as claimed in claim 18, wherein the continuous layer includes at least one of a metal or a conductive compound of a metal.

20. A method as claimed in claim 19, wherein the continuous layer includes a silicide.

\* \* \* \* \*